United States Patent
Yamada et al.

(10) Patent No.: US 6,374,028 B2
(45) Date of Patent: *Apr. 16, 2002

(54) RIDGE WAVEGUIDE-TYPE OPTICAL SEMICONDUCTOR DEVICE AND METHOD OF FABRICATING THE SAME

(75) Inventors: Koji Yamada; Koji Nakamura, both of Tokyo (JP)

(73) Assignee: Oki Electric Industry Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/222,866

(22) Filed: Dec. 30, 1998

(30) Foreign Application Priority Data

Jan. 7, 1998 (JP) .......................................... 10-013421

(51) Int. Cl.[7] .................................................. G02B 6/10
(52) U.S. Cl. ........................ 385/131; 385/28; 385/132
(58) Field of Search ............................ 438/57; 385/131, 385/132, 28

(56) References Cited

U.S. PATENT DOCUMENTS

| | | | | |
|---|---|---|---|---|
| 5,572,616 A | * | 11/1996 | Aoki et al. | 385/131 |
| 5,666,455 A | * | 9/1997 | Aoki et al. | 385/131 |
| 5,737,474 A | * | 4/1998 | Aoki et al. | 385/131 |
| 5,805,630 A | * | 9/1998 | Valster et al. | |
| 6,134,368 A | * | 10/2000 | Sakata | |

* cited by examiner

Primary Examiner—Hung N. Ngo
(74) Attorney, Agent, or Firm—Rabin & Berdo, P.C.

(57) ABSTRACT

A ridge waveguide-type optical semiconductor device and a method of fabricating the same. The method of fabrication includes forming a first clad layer, a core layer, a second clad layer and a contact layer, in the stated order on a semiconductor substrate, forming a strip-shaped etching mask on the contact layer, removing the contact layer and the second clad layer selectively by etching, using the etching mask, until the core layer is exposed, so as to form a ridge including etched second clad layer, and forming a semiconductor layer by crystal growth, so as to form a mode control layer on the exposed surface of the core layer. The semiconductor device includes a semiconductor substrate, a first clad layer formed on the substrate, a core layer serving as a waveguide, on the first clad layer, and a strip-shaped second clad layer on the core layer. A mode control layer is formed on the core layer, and insulating layers are formed on the mode control layer, at opposite sides of the second clad layer. To confine light to waveguide, the mode control layer has a refractive index equal to or less than a refractive index of the core layer, and is larger than refractive indexes of the respective insulating layers.

22 Claims, 4 Drawing Sheets

RIDGE WAVEGUIDE-TYPE OPTICAL SEMICONDUCTOR DEVICE AND METHOD OF FABRICATING THE SAME

FIELD OF THE INVENTION

The invention relates to a ridge waveguide-type optical semiconductor device and to a method of fabricating the same.

BACKGROUND OF THE INVENTION

Optical semiconductor devices which employ an optical waveguide layer (core layer) between clad layers, for example a semiconductor laser diode or an optical electro-absorption modulator, are known. In general, these optical devices require a single parallel horizontal mode. A ridge waveguide is preferred to provide the single transverse mode.

In manufacturing a ridge waveguide-type optical semiconductor on a semiconductor substrate, a first clad layer, an optical waveguide layer (core layer), a second clad layer and a contact layer are stacked sequentially. The stacked structure is etched selectively so that a belt-like ridge portion consisting of the second clad layer and the contact layer is formed.

In forming the ridge, the etching does not completely remove the second clad layer, so that the remainder of the second clad layer forms a mode control layer at both side of the ridge. The mode control layer favors a single transverse mode. However, controlling the thickness of the mode control layer is difficult. Therefore, it is difficult to consistently manufacture the device with the same properties.

SUMMARY OF THE INVENTION

It is therefore an object of the invention to provide a ridge waveguide-type optical semiconductor device and a method of fabricating the same, which solve the above-described problem. According to the present invention, such a method includes forming a first clad layer, a core layer to serve as a waveguide, a second clad layer and a contact layer, in the stated order on a semiconductor substrate, forming a strip-shaped etching mask on the contact layer, removing the contact layer and the second clad layer selectively by etching, using the etching mask, until the core layer is exposed, so as to form a ridge including the etched second clad layer, and forming a semiconductor mode control layer by crystal growth, on the exposed surface of the core layer.

Therefore, contrary to the above-described conventional method, the mode control layer is formed only after the second clad layer is etched selectively. Compared to the conventional etching process, it is possible to form the mode control layer with a required thickness and showing comparatively greater uniformity. As a result, it is possible to fabricate the ridge waveguide-type optical device consistently of with the same mode properties.

Moreover, according to the invention, the refractive index of the mode control layer is selected so as to confine light within a waveguide. Also, the semiconductor material for the mode control layer is selected in view of the desired electrical operation of the device. Therefore, the efficiency of operation of the device is improved.

BRIEF DESCRIPTION OF THE DRAWING

The objects and features of the present invention will become more apparent from the consideration of the following detailed description taken in conjunction with the accompanying drawings in which.

DESCRIPTION OF THE PREFERRED EMBODIMENT

<The First Embodiment>

FIGS. 1(a) to 1(e) illustrate in schematic view a manufacturing process according to a first embodiment of the invention.

Figure 1A:
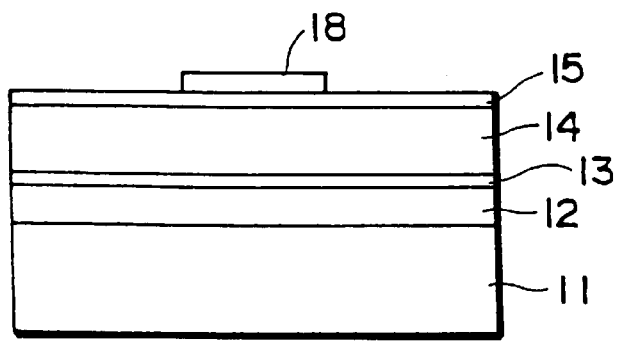
FIGS. 1(a) to 1(e) are schematic views of a first embodiment according to the invention.

In FIG. 1(a), an n-InP lower clad layer 12 as a first clad layer, an undoped InGaAsP core layer 13 as an optical waveguide layer, an p-InP upper clad layer 14 as a second clad layer and a p-InGaAs contact layer 15, are formed in the stated order on an n-InP substrate 11.

These layers 12–15 are formed by, for example, MOVPE (metal organic vapor phase epitaxial) deposition. A multi quantum well structure can be employed for the core layer 13.

A strip-shaped etching mask 18 made of, for example, a dielectric material, is formed on the contact layer 15 by conventional photolithography. When a crystal growth surface of the contact layer 15 is a (100) surface, the etching mask 18 can be formed along the direction <011>.

Figure 1B:
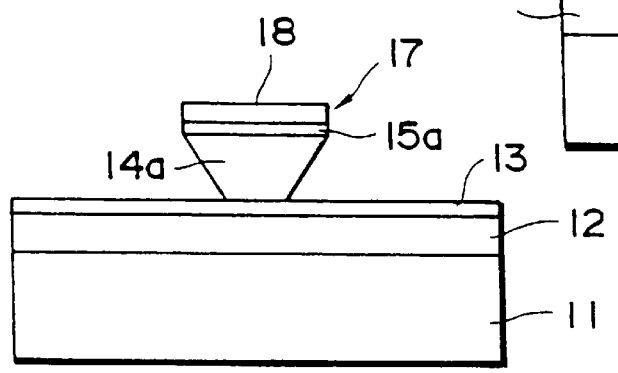

As shown in FIG. 1(b), the contact layer 15 is etched selectively with the etching mask 18 using conventional dry etching to form a contact layer portion 15a under the mask 18. The contact layer portion 15a has approximately the same shape as the mask 18 and has side walls perpendicular to the substrate surface.

Then the upper clad layer 14 is etched selectively by conventional wet etching, using a mixture of hydride bromide and acetic acid as the etchant. This etchant removes much more InP of the upper layer 14 than InGaAsP of the core layer 13. Thus vertical etching by this etchant stops when the core layer 13 is exposed. On the other hand, horizontal etching of the upper clad layer 14 by this etchant stops at approximately the (111) surface, leaving the etched upper clad layer 14a shown in FIG. 1(b).

Therefore, as shown in FIG. 1(b), a reverse mesa-shaped ridge 17, including the upper clad layer 14a, is formed. On both sides of the ridge 17, the core layer 13 is exposed.

Figure 1D:
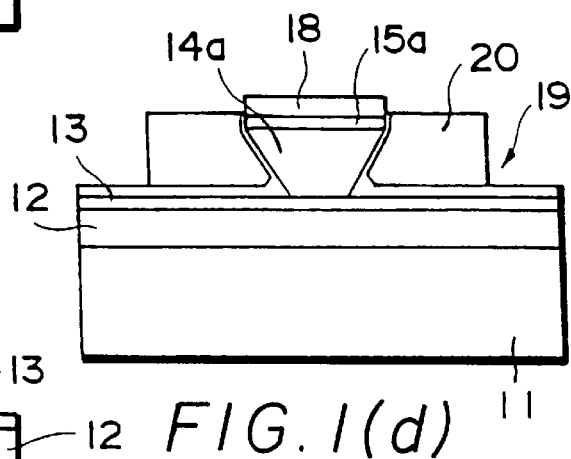
Figure 1E:
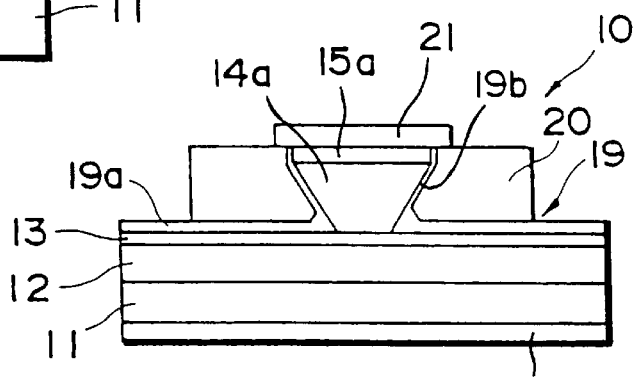
Figure 1C:
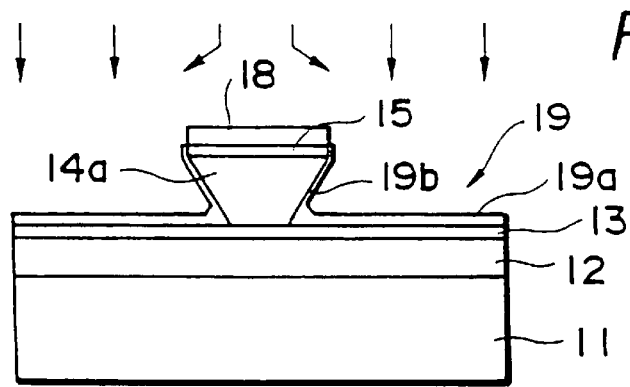

Then, as shown in FIG. 1(c), in order to form a mode control layer 19a, a semiconductor layer 19 is grown on the exposed surface of the upper clad layer 14a and core layer 13 by a conventional epitaxial growth method. The thickness of the semiconductor layer 19 is 0.2 $\mu$m, for example. The semiconductor layer 19 is made of p-InP, which is the same material as the upper clad layer 14a. The impurity density of the semiconductor layer 19 is less than that of the upper layer 14a.

Side wall portions 19b of the semiconductor layer 19 are formed on side walls of the ridge 17. The semiconductor layer 19 is formed on the exposed surface of the core layer 13 by a crystal growth method. Therefore, compared to the conventional etching process, it is possible to form the mode control layer 19a with a thickness having comparatively greater uniformity.

Then, as shown in FIG. 1(d), both sides of the ridge 17 are buried in, for example, an insulating layer 20 of organic insulating material such as polyimide. An inorganic dielectric material also may be used for the insulating layer 20.

The refractive index of each layer depends on it's material and composition. In order to confine light within a waveguide including the core layer 13, the refractive index of the mode control layer 19a is selected to be equal to or less than that of the core layer 13 and larger than that of the insulating layer 20. In this embodiment, the refractive index of the lower clad layer 12, the upper clad layer 14 and the mode control layer 19a is 3.172. The refractive index of the core layer 13 is selected to be 3.45 and that of the insulating layer 20 is selected to be 1.8.

Then the etching mask 18 is removed so that surface of the contact layer 15 is exposed. As shown in FIG. 1(e), an upper electrode 21 is formed on the contact layer 15 by conventional metal spattering. The substrate 11 is ground at it's bottom, if necessary, so as to have the required thickness. A lower electrode 22 similarly is formed by the metal spattering on the bottom surface of the substrate 11. The upper electrode 21 can be formed by evaporation. An end-facet of the core layer 13 is coated with an antireflection film to prevent reflection, if necessary.

Figure 2:
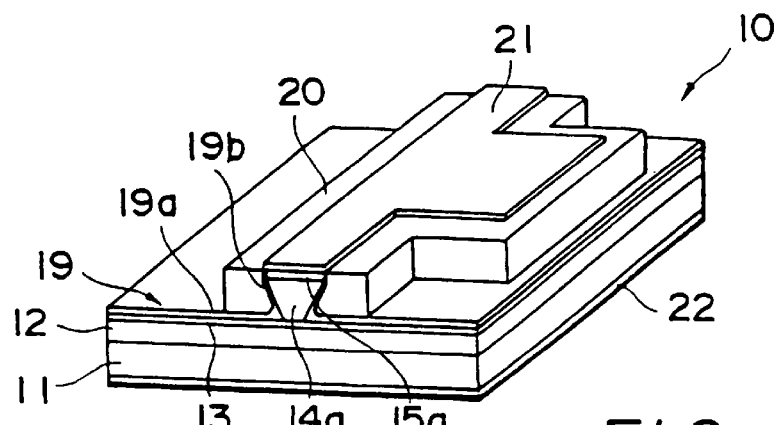
FIG. 2 is a oblique view of a first embodiment.

FIG. 2 is an oblique view of a ridge waveguide type optical semiconductor device 10 fabricated according to the above-described process. This optical semiconductor device 10 functions, for example, as an optical electro-absorption modulator when a reverse voltage is applied between the electrodes 21, 22.

As described above, it is possible to form the mode control layer 19a with a uniform thickness. Thus, even if the ridge 17 has a relatively large width, a single transverse mode is consistently obtained.

Therefore, according to the invention, it is possible to fabricate the ridge waveguide-type optical semiconductor device 10 with less electrical resistance and with consistency of mode properties.

Also, according to the invention, the density of impurity in the mode control layer 19a is selected to be less than that of the upper clad layer 14a. This substantially reduces capacitance of p-i-n junction. Therefore, when a reverse bias voltage is applied between the electrodes 21 and 22, the electric field affects the efficiency of the optical waveguide in a way which is regulated by the bottom width of the upper clad layer 14a.

Since the density of impurity in the mode control layer 19a is selected to be less than that of the upper clad layer 14a, when the optical semiconductor device 10 is used as a laser diode with a forward bias voltage, the diffusion of electric current through the mode control layer 19a is reduced. Therefore, the current injection in the optical waveguide is improved.

Although the ridge 17 is a type of reverse means in this embodiment, the ridge 17 can be a normal mesa or a perpendicular mesa.

Figure 3:
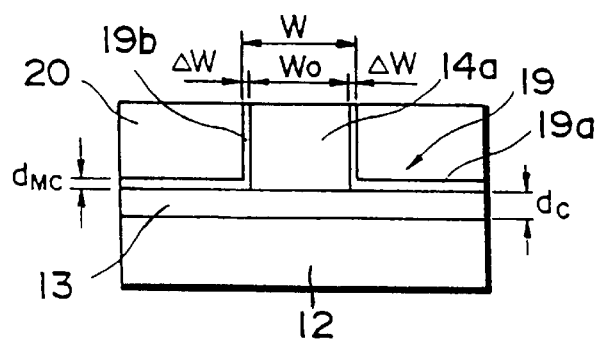
FIG. 3 is a schematic view of a calculation model of the first embodiment.

The relationship between the width of the ridge 17 required to cut off a high order mode, and the mode control layer 19a, is calculated according to a model shown in FIG. 3. To simplify the calculation, a perpendicular mesa is adopted for the ridge 17 in FIG. 3. In the case of the reverse mesa, the width Wo of the ridge 17 is the width at the bottom surface in contact with the core layer 13.

In the calculation, as described above, the refractive indexes of the lower clad layer 12, the upper clad layer 14 and the mode control layer 19a are all 3.172. The refractive index of the core layer 13 is 3.45 and that of the insulating layer 20 is 1.8.

The maximum width Wc of the ridge 17 to cut off a high mode and therefore to achieve a single transverse mode, is obtained according to the following Equation (1).

$$Wc = Wo + 2\Delta W = Wo + 2rdMC \tag{1}$$

Herein, Wo is the width of the ridge 17 without the side wall portion 19b, $\Delta W$ is the thickness of the side wall portion 19b, dMC is the thickness of the mode control layer 19a, and r is the ratio of the thickness $\Delta W$ of the side wall portion 19b to the thickness dMC of the mode control layer 19a, that is the thickness ratio $\Delta W/dMC$.

Therefore, the condition to achieve the single transverse mode is obtained according to the following Equation (2):

$$dMC < (Wc - Wo)/(2r) \tag{2}$$

By the conventional equivalent refractive index method based on Equation (2), the relationship between the thickness of the mode control layer 19a and the width of the ridge 17 without the side wall portion 19b is calculated. Results of the calculation are shown in FIG. 4.

For this calculation, the refractive indexes are selected as described above, and the wavelength of light is selected to be 1.55 $\mu$m. The calculation is performed for each of three values of the thickness ratio, namely 0.25, 0.5 and 1.0. As the thickness dc of the core layer 13, thicknesses 0.2 $\mu$m, 0.25 $\mu$m and 0.3 $\mu$m are selected.

Figure 4:
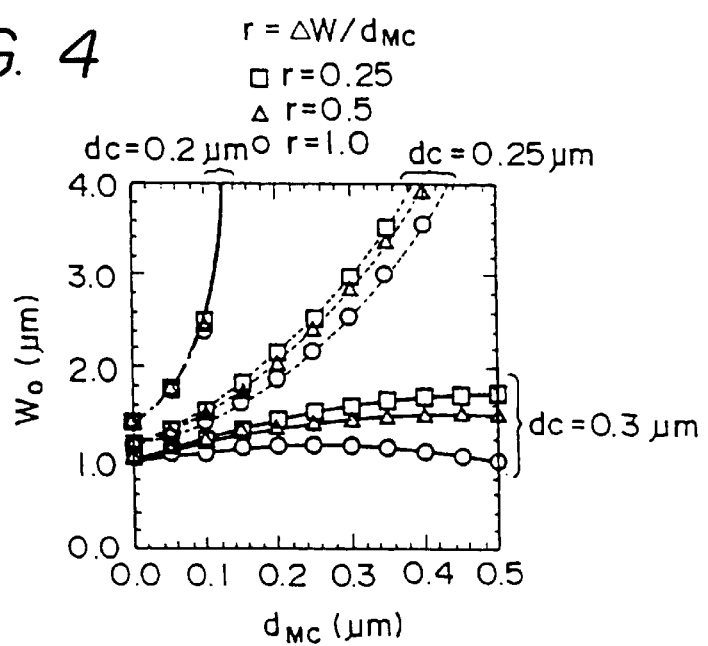
FIG. 4 is a graph showing cut-off condition.

In FIG. 4, the horizontal axis represents the thickness dMC of the mode control layer 19a and the vertical axis represents the width Wo of the ridge 17 without the side wall portion 19b. For example, when the thickness dc of the core layer 13 is 0.25 $\mu$m and the thickness ratio r is 0.25, the width Wo of the ridge 17 is selected to be less than approximately 3 $\mu$m, so as to achieve the single transverse mode.

In addition, when the thickness dc of the core layer 13 is 0.25 $\mu$m for example, the maximum width of the ridge 17 with which the cut-off can be obtained, decreases from approximately 3 $\mu$m to approximately 2.5 $\mu$m as the thickness ratio r increases from 0.25 to 1.0. This means that it is required to reduce the thickness of the side wall portion 19b in order to increase the width of the ridge 17. A thinner side wall portion 19b is also required in view of the optical propagation loss.

Figure 5A:
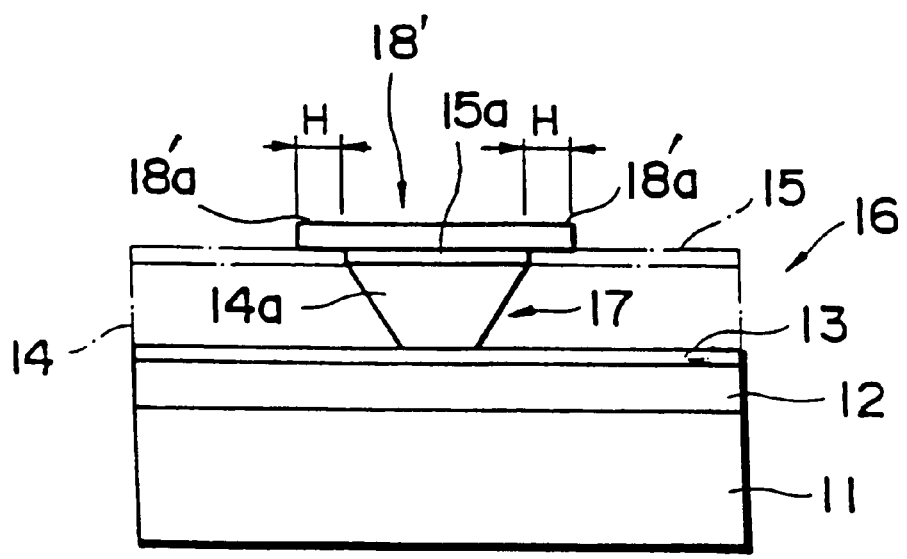
FIGS. 5(a) and 5(b) are schematic views of a modification of the first embodiment.
Figure 5B:
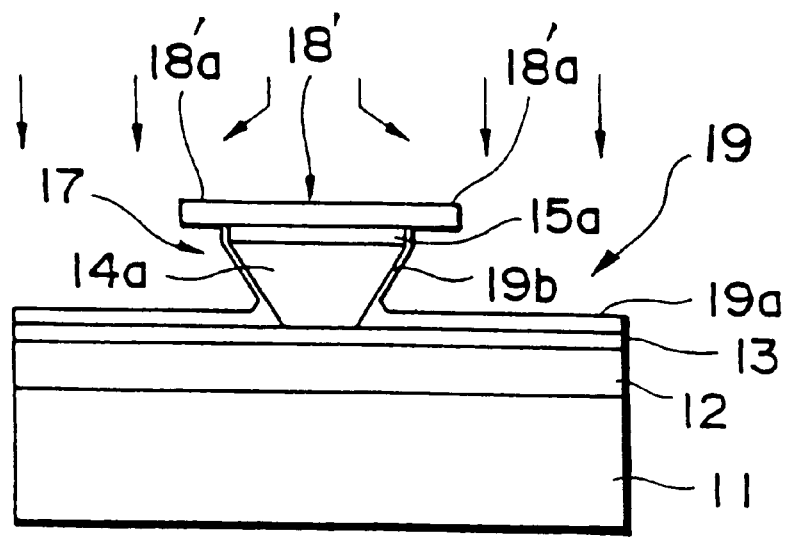

FIGS. 5(a) and 5(b) show a modified fabricating process suitable for reducing the thickness of the side wall portion 19b.

As shown in FIG. 5(a), a strip-shaped mask 18' is formed on the contact layer 15. The mask 18' is wider than the mask 18 shown in FIG. 1(a). The contact layer 15 and the upper layer 14 are selectively etched with the mask 18' using an isotropic etching procedure, for example wet etching. As a result, the ridge 17 is formed with almost the same width as the ridge shown in FIG. 1(b), so that the mask 18' has an overlapping portion 18'a at each side of the etched upper clad layer 14a of a length H.

Then, as shown in FIG. 5(b), in growing the semiconductor layer 19 on the now exposed surface, the growth of the side wall portion 19b is substantially disturbed by the overlapping portion 18'a. The thickness ratio r of the side wall portion 19b to the mode control layer 19a is therefore reduced.

Accordingly, the ridge 17 can have a greater width, so that the electric resistance of the ridge 17 is reduced. In addition, because the side wall portion 19b is thinner, the loss of light propagation is reduced.

<The Second Embodiment>

Figure 6:
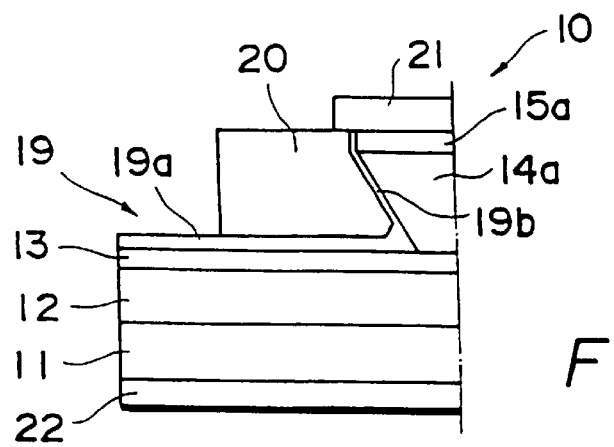
FIG. 6 is a schematic view of a second embodiment according to the invention.

The second embodiment of the invention is illustrated in FIG. 6. In this embodiment, the semiconductor layer 19 is made of a semiconductor material which has the opposite conductivity-type to that of the upper layer 14a, or in the alternative, is undoped.

When a forward voltage is applied between the electrodes 21 and 22 for a specified purpose, the carriers are effectively prevented to move along the mode control layer 19a. Thus, the efficiency of current injection is improved.

When a reverse voltage is applied between the electrodes 21 and 22 for another purpose, the capacitance of the waveguide is regulated according to the width Wo of the ridge 17, but is not affected by the mode control layer 19a and the side wall portions 19b. Therefore, the capacitance can be reduced so that the high frequency properties of the device are improved. Moreover, the influence of photo-current in a region apart from the ridge 17 is prevented. In addition, if an undoped semiconductor material is selected for the mode control layer 19a, the optical absorption-loss is reduced.

<The Third Embodiment>

Figure 7:
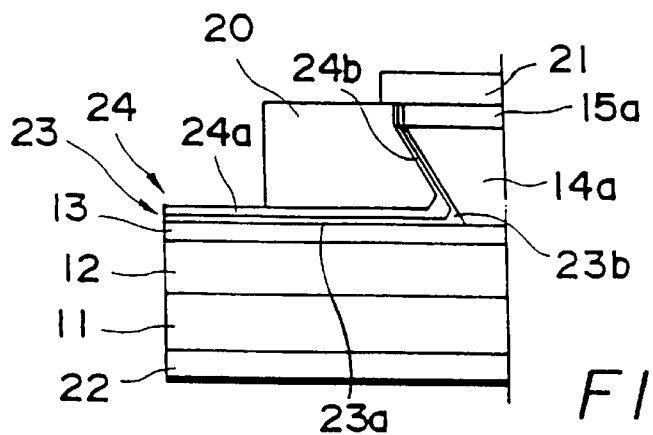
FIG. 7 is a schematic view of a third embodiment according to the invention.

The third embodiment of the invention is illustrated in FIG. 7. In this embodiment, instead of the semiconductor layer 19 of the previously described embodiments, a double layered structure is employed, including an inner layer 23 which covers the core layer 13, and an outer layer 24.

The inner layer 23 is made of, for example, a semiconductor material having the same conductivity-type as the upper clad layer 14. The thickness of a mode control layer 23a covering the core layer 13 is selected to be 0.05 μm or less. The density of impurity in the inner layer 23 is, like in the above-described embodiments, selected to be less than that of the upper clad layer 14a.

The outer layer 24 covering the inner layer 23 is made of a semiconductor material which has the opposite conductivity-type to that of the upper layer 14a, or is undoped. The sum of the thickness of the control layers 23a and 24a correspond to the thickness of dMC of the mode control layer 19a in the previous embodiments. In view of this, the thickness of the mode control layer 24a is selected so as to achieve the single transverse mode.

Since the inner layer 23 has the same conductivity-type as the upper clad layer 14a, when a forward bias voltage is applied between the electrodes 21 and 22, the carriers tend to move apart from the ridge 17 along the mode control layer 23a. But the mode control layer 23a, being extremely thin, has high electrical resistance. The electric current prefers to flow through the upper clad layer 14a since the latter has less electrical resistance. Therefore, it is possible to retain the electric current efficiently in the optical waveguide.

Also when a reverse bias voltage is applied between the electrodes 21 and 22, since the mode control layer 23a has high resistance, diffusion of the electric current through the mode control layer 23a is prevented. Therefore, the capacitance is reduced so that the device is advantageous for high frequency operation.

In addition, if undoped semiconductor material is selected for use in forming the outer layer 24, the optical absorption-loss, especially absorption-loss of free carriers, is reduced.

The double layered structure of the inner layer 23 and the outer layer 24 can be replaced with a multi (three of more) layered structure. If the multi-layered structure is used, the density of impurity and the conductivity type are individually selected for each layer. Also, the double layered structure can be replaced with a single layer in which the density or species of impurity gradually changes from the bottom surface to the top.

<The Fourth Embodiment>

Figure 8:
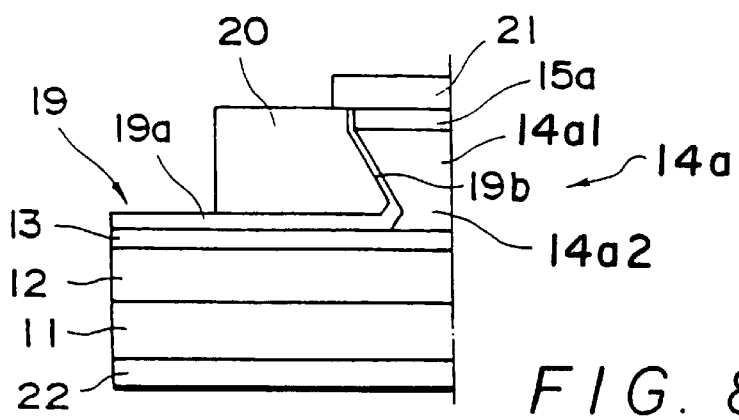
FIG. 8 is a schematic view of a fourth embodiment according to the invention.

The fourth embodiment of the invention is illustrated in FIG. 8. In this embodiment, the upper clad layer 14a has an upper reverse mesa-shaped portion 14a1 and a lower normal mesa-shaped portion 14a2 in contact with the core layer 13. To produce this shape, in etching of the upper clad layer 14 shown in FIG. 1(a), the etching is stopped before the reverse mesa is formed completely, so as to retain the normal mesa portion 14a2.

When the semiconductor layer 19 is grown to form the mode control layer 19a, the normal mesa portion 14a2 helps the crystal growth so that the mode control layer 19a has better crystallinity.

The angles at which the side surfaces of the upper clad layer 14a intersect the core layer 13 is relatively large. Therefore, the concentration of the electric field and the optical recombination are reduced so that the durability of the device is improved.

Although InP is used for the substrate 11, and InGaAsP and the InGaAs are used for semiconductor layers 12–15 in the above embodiments, other semiconductor materials can be suitably selected. Similarly, for the semiconductor layer 19, besides the InP used in the above-described embodiments, other alternative semiconductor materials such as GaAs, AlGaAs, InGaAsP and InGaAlAs can be employed.

To achieve the single transverse mode, a wider ridge 17, and therefore a thicker mode control layer 19a, 23a or 24a is required. However, to confine light efficiently within the waveguide, FIG. 4 shows that to satisfy the cut-off condition, the thickness of the mode control layer should be selected to be 0.4 μm or less when the thickness of the core layer is 0.3 μm or less.

The invention is applicable not only to an optical modulator as described in the above embodiments, but also, for example to manufacturing an optical amplifier, an optical filter, an optical spot-size modulator, a laser diode or a photo-diode.

As described above, according to the invention, after the second clad layer is etched selectively, a semiconductor layer is grown to form the mode control layer. Therefore, compared to the conventional etching process, it is possible to form the mode control layer with a required thickness and showing comparatively greater uniformity. As a result, it is possible to fabricate the ridge waveguide-type optical device with consistent mode properties.

Moreover, according to the invention, the refractive index of the mode control layer is selected so as to confine light within a waveguide. Also, a semiconductor material for the mode control layer is selected in view of the desired electrical operation of the device. Therefore, the efficiency of operation of the device is improved.

What is claimed is:

1. A ridge-waveguide-type optical semiconductor device, comprising:
    a semiconductor substrate having a principal surface;
    a first clad layer having opposite upper and lower surfaces, the first clad layer lower surface formed on the substrate principal surface;
    a core layer serving as a waveguide, and formed on the first clad layer upper surface;
    a second clad layer provided selectively on the core layer, the second clad layer being strip-shaped;

a semiconductor layer formed on the core layer; and insulating layers formed on the semiconductor layer at opposite sides of the second clad layer, wherein the semiconductor layer has a refractive index equal to or less than a refractive index of the core layer and larger than refractive indices of the respective insulating layers.

2. A semiconductor device according to claim 1, wherein the semiconductor layer has a density of impurity which is less than a density of impurity in the second clad layer.

3. A semiconductor device according to claim 1, wherein the semiconductor layer and the second clad layer are of opposite conductivity type.

4. A semiconductor device according to claim 1, wherein the second clad layer is reverse mesa-shaped.

5. A semiconductor device according to claim 1, wherein the semiconductor layer has a multi-layered structure.

6. A semiconductor device according to claim 1, wherein the semiconductor layer comprises an inner layer and an outer layer, wherein the inner layer contacts the core layer and is thinner than the outer layer, has the same conductivity type as the second clad layer, and has a lower density of impurity than the second clad layer, and wherein the outer layer covers the inner layer, has a conductivity type opposite to that of the second clad layer, and has a lower density of impurity than the second clad layer.

7. A ridge waveguide-type optical semiconductor device according to claim 1, wherein a thickness of the core layer is equal to or less than 0.4 $\mu$m.

8. A ridge-waveguide type optical semiconductor device according to claim 1, wherein the semiconductor layer has other portions projecting away at an angle from the one portion along the core layer upper surface.

9. A ridge waveguide-type optical semiconductor device, comprising:

a semiconductor substrate having a principal surface;

a first core layer having a first surface formed on the principle surface of the substrate and a second surface opposite to the first surface;

a core layer serving as a waveguide, formed on the second surface of the first core layer;

a second clad layer selectively formed on the core layer, the second clad layer having a reverse mesa shape;

a semiconductor layer formed on the core layer and the second clad layer; and insulating layers formed on the semiconductor layer, wherein the second clad layer is located between the insulating layers.

10. A ridge waveguide-type optical semiconductor device according to claim 9, wherein the semiconductor layer has a refractive index equal to or less than a refractive index of the core layer and larger than refractive indices of the respective insulating layers.

11. A ridge waveguide-type optical semiconductor device according to claim 9, wherein the semiconductor layers and the second clad layer are of opposite conductivity types.

12. A ridge waveguide-type optical semiconductor device according to claim 9, wherein the semiconductor layer has a density of impurity which is less than a density of impurity of the second clad layer.

13. A ridge waveguide-type optical semiconductor device according to claim 9, wherein the semiconductor layer has a multi-layered structure.

14. A ridge waveguide-type optical semiconductor device according to claim 9, wherein a thickness of the core layer is equal to or less than 0.4 $\mu$m.

15. A ridge waveguide-type optical semiconductor device, comprising:

a semiconductor substrate having a principle surface;

a first core layer having a first surface formed on the principal surface of the substrate and a second surface opposite to the first surface;

a core layer serving as a waveguide, formed on the second surface of the first core layer;

a second clad layer selectively formed on the core layer, the second clad layer having a first density of impurity;

a semiconductor layer formed on the core layer and the second clad layer; and insulating layers formed on the semiconductor layer so that the second clad layer is located between the insulation layers, wherein the semiconductor layers have a second density of impurity that is less than the first density.

16. A ridge waveguide-type optical semiconductor device according to claim 15, wherein the semiconductor layer has a refractive index equal to or less than a refractive index of the core layer and larger than refractive indices of the respective insulating layers.

17. A ridge waveguide-type optical semiconductor device according to claim 15, wherein the semiconductor layers and the second clad layer are of opposite conductivity types.

18. A ridge waveguide-type optical semiconductor device according to claim 15, wherein the semiconductor layer has a multi-layered structure.

19. A ridge waveguide-type optical semiconductor device according to claim 15, wherein the second clad layer has a reverse mesa shape.

20. A ridge waveguide-type optical semiconductor device according to claim 15, wherein a thickness of the core layer is equal to or less than 0.4 $\mu$m.

21. In a ridge-waveguide-type optical semiconductor device having a semiconductor substrate, a first clad layer on the substrate, a core layer serving as a waveguide, formed on the first clad layer, the core layer having opposite upper and lower layers, and a second clad layer on the core layer, the improvement wherein the second clad layer is provided selectively on the core layer so as to form a ridge having a lower surface covering only a limited, strip-shaped portion of the core layer upper surface, outside portions of the core layer upper surface extending laterally in opposite directions outside the strip-shaped portion, further comprising a semiconductor layer, one portion of the semiconductor layer formed on the outside portions of the core layer upper surface at opposite sides of the strip-shaped portion of the core layer upper surface, and insulating layers formed on the one portion of the semiconductor layer on opposite sides of the second clad layer, wherein the semiconductor layer has a refractive index equal to or less than a refractive index of the core layer and larger than refractive indices of the respective insulating layers.

22. A ridge-waveguide type optical semiconductor device according to claim 21, wherein the semiconductor layer has other portions projecting away at an angle from the one portion along the core layer upper surface.

* * * * *